United States Patent
Chakradhar et al.

(10) Patent No.: US 6,467,058 B1
(45) Date of Patent: Oct. 15, 2002

(54) SEGMENTED COMPACTION WITH PRUNING AND CRITICAL FAULT ELIMINATION

(75) Inventors: Srimat T. Chakradhar, Old Bridge, NJ (US); Surendra K. Bommu, Marlboro, MA (US); Kiran B. Doreswamy, Princeton, NJ (US)

(73) Assignee: NEC USA, Inc., Princeton, NJ (US)

( * ) Notice: Subject to any disclaimer, the term of this patent is extended or adjusted under 35 U.S.C. 154(b) by 0 days.

(21) Appl. No.: 09/389,590

(22) Filed: Sep. 3, 1999

Related U.S. Application Data

(60) Provisional application No. 60/116,588, filed on Jan. 20, 1999.

(51) Int. Cl.⁷ .............................................. G06F 11/00
(52) U.S. Cl. ........................................ 714/745; 714/738
(58) Field of Search ................................ 714/745, 738, 714/724

(56) References Cited

U.S. PATENT DOCUMENTS 5,983,381 A * 11/1999 Chakradhar et al. ........ 714/738
5,987,636 A * 11/1999 Bommu et al. ............. 714/738
6,223,316 B1 * 4/2001 Bommu et al. ............. 714/738

* cited by examiner

Primary Examiner—Phung M. Chung
(74) Attorney, Agent, or Firm—Sughrue Mion, PLLC

(57) ABSTRACT

A method of generating a vector set, said vector set being used for testing sequential circuits. The method comprises selecting a plurality of fault models, identifying a fault list each for each of said plurality of fault models, identifying a vector set each for each of said fault lists, selecting a tolerance limit each for each of said fault lists, thereby each fault model having an associated fault list, an associated vector set and an associated tolerance limit, compacting each of said vector set such that the compacted vector set identifies all the faults in the associated fault list or a drop in fault list coverage is within the associated tolerance limit; and creating a vector set by combining all vector sets compacted. A system and a computer program product for testing circuits with a compacted vector set where the compacted vector set is created by dropping faults based on a tolerance limit.

26 Claims, 15 Drawing Sheets

FIG. 2

Algorithm SCOPE($F_u$,D)
    $F_u$: Input fault list
    D: Detection times for all faults
{
1.   *CompactSet = Nil* ; $F_D$ = *Nil*
2.   *base = Maximum$_{f \in Fu}$ (D[ f ])* ;
3.   $F_T = \{ f \mid f \in F_u \& D[f] = base\}$ ;
4.   $F_D$ = *Nil*;
5.   RESET_LOW_HIGH ($F_u$, *base+1*) ;
6.   while ($F_u \ne Nil$) {
7.      OVERLAPPED_VALIDATION ($F_u$, $F_T$, $F_D$, *base*) ;
8.      if ($F_T \ne Nil$) {
10.       if (SEGMENT_FOUND ($F_u$, $F_T$, $F_D$, *base*)) {
11.         OVERLAPPED_REFINEMENT ($F_u$, $F_T$, $F_D$, *base*) ;
12.         SEGMENT_PRUNE ($F_D$, *base*, *CompactSet*) ;
13.         *base = Maximum $_{f \in Fu}$ (D [ f ])*; $F_D$ = *Nil* ;
14.         $F_T = \{ f \mid f \in F_u \& D[f] = base \}$ ;
15.         RESET_LOW_HIGH ($F_u$, *base+1*) ;
16.       }
17.      }
18.      else{
19.        *base=Maximum $_{f \in Fu}$ (D[ f ])* ;
20.        $F_T = \{ f \mid f \in F_u \& D[f] = base\}$ ;
21.      }
22.   }
23.   return (*CompactSet*) ;
}

FIG. 3

Algorithm OVERLAPPED_VALIDATION($F_u$, $F_T$, $F_D$, base)
   $F_u$: Undetected fault list
   $F_T$: Current target fault list
   $F_D$: Set of faults detected by current segment
   base: Restoration for $F_T$ begins from vector $v_{base}$
{
1. $i = low = 0$ ;
2. $start = Minimum_{f \in FT}(HIGH[f])$ ;
3. while ($F_T$ not detected) {
4.    $low = Maximum(start-2^i, low)$ ; $i$ ++ ;
5.    $Seq = \{v_{low}, ..., v_{base}\}$ ;
6.    $F_s = \{f \mid f \in F_u \& D[f] \geq low \& HIGH[f] > low\}$ ;
7.    $D_{Seq} \leftarrow FAULT\_SIMULATE(Seq, F_s)$ ;
8.    UPDATE_LOW_HIGH($F_s$, $low$, $D_{Seq}$) ;
9.    UPDATE_TARGETS($F_T$, $F_u$, $F_D$) ;
10.   if (DROP_CRITICAL_TARGETS($F_D$, $F_u$, $F_T$, base))break ;
11.}
12.return;
}

FIG. 4

Algorithm UPDATE_LOW_HIGH ($F$, *index*, $D_{Seq}$)
    $F$: fault list being updated
    *index:* index of first vector in sequence used for fault simulation
{
1. for each ($f \in F$) {
2.    if ($f$ is detected) {
3.       $LOW[f]$ = MAXIMUM ($LOW[f]$, *index*) ;
4.       $ND[f]$ = MAXIMUM ($ND[f]$, $D_{Seq}[f]$) ;
5.    } else {
6.       $HIGH[f]$ = MINIMUM ($HIGH[f]$, *index*) ;
7.    }
8. }
9. return;
}

FIG. 5

Algorithm UPDATE_TARGETS ($F_T$, $F_u$, $F_D$)
    $F_T$: current target fault list
    $F_u$: current set of undetected fault list
{
1.   do{
2.      Target_Changed=False;
3.      $f_p = (f | f \in F_u - F_T, D[f]$ is highest) ;
4.      $high = Minimum_{f \in F_T} (HIGH[f])$ ;
6.      if $(high \leq D[f_p] + 1$ & $HIGH[f_p] \leq D[f_p])${
7.        $F_T = F_T \cup f_p$;
8.        Target_Changed = True ;
9.      }
10.    $F_{det} = \{f | f \in F_T, LOW[f] \geq high\}$ ;
11.    $F_T = F_T - F_{det}$ ;
12.    $F_u = F_u - F_{det}$ ;
13.    $F_D = F_D \cup F_{det}$ ;
13.    MARK_FAULTS_DETECTED($F_{det}$) ;
14.   } while (Target_Changed = True)
15. return;
}

FIG. 6

Algorithm SEGMENT_FOUND ($F_u$, $F_T$, $F_D$, base)
    $F_u$: current undetected fault list
    $F_T$: current target fault list
    $F_D$: Set of faults detected by current segment
    base: last vector of new segment(if any) is vector $v_{base}$
{
1. status = Uncertain ;
2. low = Minimum $_{f \in F_T}$ (LOW [$f$] ) ;
3. while (status = Uncertain) {
4.    $F_c$ = { $f$ |( $f \in F_u$ & D [$f$] $\geq$ low & HIGH [$f$] $\leq$ low} ;
5.    if ($F_c$ == Nil) {
6.      status = Segment_found ;
7.    }else{
8.      low = 1+Maximum $_{f \in F_c}$ (D[$f$] ) ;
9.      Seq = { $v_{low}$, ..., $v_{base}$} ;
10.     $F_s$ = {$f$ | $f \in F_u$ &[ $f$] $\geq$ low & HIGH [$f$] > low} ;
11.     FAULT_SIMULATE (Seq, $F_s$) ;
12.     UPDATE_LOW_HIGH ($F_s$, low) ;
13.     if ($F_T$ is detected){
14.       MARK_FAULTS_UNDETECTED ($F_s$) ;
15.     } else {
16.       UPDATE_TARGETS ($F_T$, $F_u$, $F_D$) ;
17.       status = No_segment
18.     }
19.    }
20. }
21. return(status) ;
}

FIG. 7

Algorithm DROP_CRITICAL_TARGETS($F_D$, $F_T$, $F_u$, base)
    $F_T$ : Current target fault list
{
1. if(CHECK_RESOURCES($F_T$, Linear_Drop($F_T$, base))){
2.    $F_u = F_u - F_T$;
2.    $F_T$ = Null ; base = -1 ;
3.    COMPUTE_REFINEMENT_TARGETS($F_D$, $F_u$, $F_T$, base) ;
4.    return( True ) ;
5. }
6. return( False ) ;
}

FIG. 8

Algorithm COMPUTE_REFINEMENT_TARGETS($F_D, F_u, F_T$, base)

$F_T$ : Current target fault list
{
1. if ($F_D == Nil$) return;
2. base = Maximum$_{f \in F_D}$ ND [$f$] ;
3. low = Minimum$_{f \in F_D}$ LOW ($f$) ;
4. high = Minimum$_{f \in F_D}$ HIGH ($f$) ;
5. $F_T$ = ($f \mid f \in F_D$ &low $\leq$ LOW ($f$) < high) ;
6. $F_u = F_u \cup F_T$;
7. $F_D = F_D - F_T$;
}

FIG. 9

Algorithm SEGMENT_PRUNING($F_D$, $F_u$, Compact Set)
    $F_D$ : set of faults detected by segment assuming
        unknown initial state
    $ND$ : Latest Detection times of faults in the segment
        assuming unknown initial state
{
1. $top = $ Minimum $_{f \in F_D}$ ($LOW[f]$); $F = F_D$ ;
2. do{
3.   ($max$, $min$, $F_{undet}$) = VALIDATE_PRUNE ($F$, $top$) ;
4.   ($opt$, $F_{undet}$) = REFINE_PRUNE ($max$, $min$, $F$) ;
6.   $F_{sim} = (f \mid f \in (F_u \cup F))$ ;
7.   $last = $ Max $_{f \in F}$ $ND[f]$ ;
8.   $Seq = (v_{opt}, ..., v_{last})$ ;
9.   $last = $ STORED_FAULT_SIM ($Seq$, $F_{sim}$, $F_{undet}$) ;
10. DROP_DETECTED_FAULTS ($F_u$, $F$) ;
11. Compact Set = Compact Set $\cup$ ($v_{opt}, ..., v_{last}$) ;
12. $top = $ Max ($last + 1$, Min $_{f \in F}$ $LOW[f]$ ;
14.}while ($F \neq Nil$) ;
15. return ;
}

FIG. 10

Algorithm VALIDATE_PRUNE($F$, $top$)
  $F$ : set of faults detected by segment assuming unknown initial state
{
1. $max = top$ ; $k = 0$) ;
2. $min = 1 + Maximum_{f \in F} ND[f]$ ;
3. do {
4.   $temp = top + 2^{k++}$ ;
5.   $F_{sim} = (f \mid f \in F \& LOW[f] < temp)$ ;
6.   $last = Maximum_{f \in Fsim} ND[f]$ ;
7.   $Seq = (\upsilon_{temp}, ..., \upsilon_{last})$ ;
8.   $F_{undet} = TRIAL\_SIM(Seq, F_{sim})$ ;
9.   if ($F_{undet} \neq Nil$)
10.    $min = temp$ ;
11.  else
12.    $max = temp$ ;
13. } while ($F_{undet} = Nil$) ;
14. return ($max, min, F_{undet}$) ;
}

FIG. 11

Algorithm REFINE_PRUNE($max$, $min$, $F$, $F_{undet}$)
$F$ : set of faults detected by segment assuming unknown initial state {
1. $F_{ret} = F_{undet}$ ;
2. while ($max \neq (min - 1)$){
3.    $temp = (max + min)/2$ ;
4.    $F_{sim} = (f \mid f \in F \& LOW[f] < temp)$ ;
5.    $last = Max_{f \in F_{sim}} DMAX[f]$ ;
6.    $Seq = (\upsilon_{temp}, ..., \upsilon_{last})$ ;
7.    $F_{undet} = $ TRIAL_SIM(Seq, $F_{sim}$) ;
8.    if ($F_{undet} \neq Nil$) {
9.      $min = temp$ ;
10.      $F_{ret} = F_{undet}$ ;
11.    }else
12.      $max = temp$ ;
13. }
14. return ($max$, $F_{ret}$) ;
}

FIG. 12

| Ckt | Original Vec | original Cov. | SCOPE− | | | SCOPE+(1%) | | |
|---|---|---|---|---|---|---|---|---|
| | | | Vec. | %R | Time(s) | Vec. | %R | Time(s) | Cov. |
| s400 | 2424 | 95.76 | 1022 | 57 | 3.5 | 502 | 79 | 2.0 | 95.51 |
| s444 | 1945 | 95.93 | 1021 | 47 | 4.2 | 688 | 64 | 3.3 | 95.69 |
| s526 | 2642 | 86.35 | 1553 | 41 | 8.1 | 1242 | 52 | 7.3 | 86.06 |
| s641 | 166 | 99.20 | 106 | 36 | 0.7 | 106 | 36 | 0.7 | 99.20 |
| s713 | 176 | 100 | 107 | 39 | 0.5 | 107 | 39 | 0.5 | 100 |
| s820 | 590 | 96.40 | 464 | 21 | 3.0 | 425 | 27 | 2.7 | 95.67 |
| s832 | 701 | 95.94 | 454 | 35 | 3.9 | 436 | 37 | 3.7 | 95.70 |
| s1196 | 574 | 99.96 | 237 | 58 | 1.3 | 237 | 58 | 1.2 | 99.96 |
| s1238 | 625 | 99.92 | 242 | 61 | 1.3 | 242 | 61 | 1.3 | 99.92 |
| s1423 | 3943 | 94.13 | 1081 | 72 | 39.3 | 904 | 77 | 43.3 | 93.42 |
| s1488 | 593 | 98.55 | 463 | 21 | 5.3 | 438 | 26 | 4.4 | 98.52 |
| s1494 | 540 | 98.42 | 463 | 14 | 4.9 | 448 | 17 | 5.1 | 98.29 |
| s5378 | 11481 | 86.12 | 838 | 92 | 116 | 570 | 95 | 110 | 85.96 |
| s35932 | 257 | 89.56 | 166 | 35 | 465 | 144 | 44 | 380 | 89.54 |

FIG. 13

| Ckt | Gates | FFs | Original Vec | Fault Cov. | SCOPE- | | | SCOPE | | | SCOPE+ (1%) | |
|---|---|---|---|---|---|---|---|---|---|---|---|---|
| | | | | | Vec. | %R | Time(s) | Vec. | %R | Time(s) | Vec. | Cov. |
| p7A | 7784 | 137 | 2405 | 99.22 | 1558 | 35 | 161 | 1295 | 46 | 108 | 98.99 |
| p7A1 | 7784 | 137 | 2507 | 98.34 | 1579 | 37 | 137 | 1351 | 46 | 123 | 98.21 |
| p7B | 6687 | 130 | 3249 | 98.14 | 1940 | 40 | 149 | 1559 | 52 | 103 | 97.73 |
| p7B1 | 6687 | 130 | 3181 | 97.63 | 1883 | 40 | 349 | 1668 | 47 | 115 | 97.27 |
| p12 | 8489 | 408 | 9330 | 99.64 | 5416 | 41 | 3310 | 3172 | 66 | 1271 | 98.66 |
| p121 | 8489 | 408 | 9468 | 99.67 | 7267 | 23 | 7836 | 3383 | 64 | 1103 | 98.68 |
| p20 | 12145 | 487 | 3268 | 99.69 | 2665 | 18 | 615 | 2270 | 30 | 336 | 99.55 |
| p201 | 12145 | 487 | 3294 | 99.65 | 2541 | 22 | 614 | 2299 | 30 | 364 | 99.39 |
| p30 | 24824 | 995 | 2953 | 99.51 | 1553 | 47 | 588 | 1553 | 47 | 582 | 99.51 |
| p29 | 62617 | 935 | 6061 | 95.00 | 5061 | 16 | 8992 | 4938 | 18 | 8517 | 95.51 |
| p175 | 62617 | 935 | 11785 | 93.51 | 10021 | 15 | 116500 | 8341 | 29 | 25881 | 93.40 |
| p306 | 223962 | 5005 | 951 | 95.00 | 900 | 5 | 17315 | 819 | 13 | 6008 | 95.03 |

SEGMENTED COMPACTION WITH PRUNING AND CRITICAL FAULT ELIMINATION

This Application claims priority from co-pending U.S. Provisional Application Serial No. 60/116,588 filed Jan. 20, 1999, which is incorporated herein by reference.

I. DESCRIPTION OF THE INVENTION

IA. Field of the Invention

The present invention is related to segmented compaction of vectors for testing sequential circuits using pruning and critical fault elimination. The present invention is embodied in methods for segmented compaction of vectors; in a system for compacting test vectors and a computer program product enabling a computer to perform segmented compaction.

IB. Background of the Invention

Circuits are tested using test sets comprising test vectors. During testing, a tester applies the test vectors in the test set to the circuit. The outputs generated by the circuit are studied to determine if certain faults exist in the circuit. As can be readily seen, the cost of testing sequential circuits is directly proportional to the number of test vectors in the test set. This is because, more the number of test vectors more is the cost of testing in terms of time and resources required. Therefore, short test sequences are desirable. Reduction in test set size can be achieved using static or dynamic test set compaction algorithms.

Several static compaction approaches for sequential circuits have been proposed. See T. M. Niermann, R. K. Roy, J. H. Patel, and J. A. Abraham, "Test compaction for sequential circuits," *IEEE Trans. Computer-Aided Design*, vol. 11, no. 2, pp. 260–267, February 1992, B. So, "Time-efficient automatic test pattern generation system," Ph.D. Thesis, EE Dept., Univ. of Wisconsin at Madison, 1994; I. Pomeranz and S. M. Reddy, "On static compaction of test sequences for synchronous sequential circuits," *Proc. Design Automation Conf*, pp. 215–220, Jun. 1996; M. S. Hsiao, E. M. Rudnick, and J. H. Patel, "Fast algorithms for static compaction of sequential circuit test vectors," Proc. *IEEE VLSI Test Symp.*, pp. 188–195, April 1995; M. S. Hsiao and S. T. Chakradhar, "State relaxation based subsequence removal for fast static compaction in sequential circuits", in *Proceedings, Design, Automation and Test in Europe (DATE)*, February, 1998; and R. Guo, I. Pomeranz and S. M. Reddy, "Procedures for static compaction of test sequences for synchronous sequential circuits based on vector restoration", in *Proceedings, Design, Automation and Test in Europe (DATE)*, February, 1998.

Some of these approaches cannot reduce test sets produced by random or simulation-based test generators. The reasons for this can be found in T. M. Niermann, R. K. Roy, J. H. Patel, and J. A. Abraham, "Test compaction for sequential circuits," *IEEE Trans. Computer-Aided Design*, vol. 11, no. 2, pp. 260–267, February 1992; and B. So, "Time-efficient automatic test pattern generation system," Ph.D. Thesis, EE Dept., Univ. of Wisconsin at Madison, 1994.

Static compaction techniques based on vector insertion, omission, and selection have already been investigated. For details, see I. Pomeranz and S. M. Reddy, "On static compaction of test sequences for synchronous sequential circuits," *Proc. Design Automation Conf*, pp. 215–220, June 1996. The above mentioned static compaction techniques require multiple fault simulation passes. If a vector is omitted or swapped, the fault simulator is invoked. This is done to ensure that the fault coverage is not affected. Fault coverage is the number of faults detected by a specific test set. Though the above mentioned static compaction techniques produce very good compaction, they are computationally intensive.

Vector restoration techniques are aimed at restoring sufficient vectors necessary to detect all faults, starting with the harder faults. Fast static test set compaction based on removing recurring subsequences that start and end on the same states has also been reported recently. For details, see R. Guo, I. Pomeranz and S. M. Reddy, "Procedures for static compaction of test sequences for synchronous sequential circuits based on vector restoration", in *Proceedings, Design, Automation and Test in Europe (DATE)*, February, 1998 and M. S. Hsiao, E. M. Rudnick, and J. H. Patel, "Fast algorithms for static compaction of sequential circuit test vectors," *Proc. IEEE VLSI Test Symp.*, pp. 188–195, April 1995. However, these test sets are not as compact as those achieved by algorithms that use multiple fault simulation passes. Recently, compaction based on vector reordering has also been proposed. For details, see M. S. Hsiao and S. T. Chakradhar, "State relaxation based subsequence removal for fast static compaction in sequential circuits", in *Proceedings, Design, Automation and Test in Europe (DATE)*, February, 1998. However, run-times using the vector reordering approach for large industrial designs are prohibitive.

Dynamic techniques perform compaction concurrently with the test generation process. Details on dynamic compaction techniques can be found in I. Pomeranz and S. M. Reddy, "Dynamic Test Compaction for Synchronous Sequential Circuits using Static Compaction Techniques," in *Proc. Fault-Tolerant Computing Symp.*, pp. 53–61, June 1996; S. T. Chakradhar and A. Raghunathan, "Bottleneck removal algorithm for dynamic compaction in sequential circuits," *IEEE Trans. on Computer-Aided Design*, (Accepted for publication) 1997, E. M. Rudnick and Janak H. Patel "Simulation-based techniques for dynamic test sequence compaction," *Proc. Intl. Conf. Computer-Aided Design*, pp. 67–73, November 1996; and T. J. Lambert and K. K. Saluja, "Methods for Dynamic Test Vector Compaction in Sequential Test Generation," in *Proc. Int. Conf. on VLSI Design*, pp. 166–169, January 1996. However, these dynamic testing techniques often require modification of the test generator.

Static compaction techniques, on the other hand, are employed after the test generation process. Therefore, they are independent of the test generation algorithm and do not require modifications to the test generator. In addition, static compaction techniques can further reduce the size of test sets obtained after dynamic compaction.

Significant progress has been made in static compaction of test sets for sequential circuits. Static compaction methods have been discussed in detail in S. K. Bommu and S. I Chakradhar and K. B. Doreswamy, "Vector Restoration using Accelerated Validation and Refinement", in *Proceedings, Asian Test Symposium*, December, 1998; R. Guo, 1. Pomeranz and S. M. Reddy, "Procedures for static compaction of test sequences for synchronous sequential circuits based on vector restoration", in *Proceedings, Design, Automation and Test in Europe (DATE)*, February, 1998; S. K. Bommu and S. T. Chakradhar and K. B. Doreswamy, "Static test sequence compaction based on segment reordering and fast vector restoration", in *Proceedings, International Test Conference*, October, 1998; and S. K. Bommu and S. T. Chakradhar and K. B.

Doreswamy, "Static compaction using overlapped restoration and segment pruning", in *Proceedings, International Conference on Computer Aided Design*, November, 1998.

However, better techniques are required to further improve the speed and quality of test set compaction.

II. SUMMARY OF THE INVENTION

Known static compaction algorithms typically compact a given test vector set so that the fault coverage is preserved. The test set is fault graded for a specific defect model (for example, stuck-at faults) to determine the fault coverage. During compaction, the chosen defect model is used to grade the compacted vector set. The present invention is a new approach for compacting vector sets for large production designs. The present invention approach is based at least on the following key observations:

(1) Test sets for production circuits safeguard against a variety of physical defects. Since all defects cannot be covered using a single defect model, test sets include tests generated using multiple defect models like stuck-at, delay, or bridging fault models. Therefore, it is unlikely that a marginal drop in fault coverage during compaction of tests generated for a single defect model will adversely affect the test quality of the overall test set.

(2) Fault coverage is an aggregate measure that can be preserved as long as the original and compacted test sets detect the same number of faults. The specific faults detected by the two test sets can be significantly different. In particular, the compacted vector set may detect new faults that are not detected by the original vector set.

In order to solve the problems mentioned in the background section, an object of the present invention is to provide a method, system and a computer program product for compacting a test set so that the fault coverage of the compacted test set either (1) equals or exceeds the fault coverage of the original test set, or (2) in cases where the coverage of the compacted set is lower than the original test set, the drop in fault coverage is within a pre-specified tolerance limit.

The pre-specified tolerance limit is translated into the maximum number of faults that can be ignored during compaction. These faults constitute the initial resources that can be expended during compaction. Other types of resource constraints are also within the scope of the present invention. The compaction process can be constrained to expend only a pre-specified number of CPU seconds.

Another object of the present invention is to establish that the number of faults allowed to be dropped while constructing a segment, is proportional to the size of the segment under construction.

In order to achieve the objects of the present invention, there is provided a method of generating a vector set, said vector set being used for testing sequential circuits, said method comprising: selecting a plurality of fault models; identifying a fault list each for each of said plurality of fault models; identifying a vector set each for each of said fault lists; selecting a tolerance limit each for each of said fault lists, thereby each fault model having an associated fault list, an associated vector set and an associated tolerance limit; compacting each of said vector set such that the compacted vector set identifies all the faults in the associated fault list or a drop in fault list coverage is within the associated tolerance limit; and creating a vector set by combining all vector sets compacted.

Preferably at least one of said tolerance limits is based on computational resources.

Preferably at least one of said tolerance limits is based on a number of faults dropped from coverage.

Preferably at least one of said tolerance limits is based on power usage.

Preferably at least one of said tolerance limits is based on heat dissipation.

Preferably faults are dropped while a segment is constructed and a number of faults dropped is proportional to a size of the segment.

Preferably said compaction comprises multiple iterations and each of said tolerance limits being dynamic and can be changed for at least one of said multiple iterations, wherein at least one of said tolerance limits can be zero.

Still preferably, said computational resource is CPU usage.

Still preferably said computational resource is memory usage.

Another aspect of the present invention is a method of generating a test vector set, said test vector set being used for testing a sequential circuit, said method comprising: specifying a fault coverage; identifying a list of faults that are covered and a list of faults that are not covered; compacting said vector set so that fault coverage after compaction is at least as large as fault coverage specified, wherein during each iteration of compaction, faults may be exchanged between said list of faults that are covered and said list of faults that are not covered.

Another aspect of the present invention is a system for testing VLSI circuits comprising a test generator, the test generator further comprising: fault model selector for selecting a plurality of fault models, a fault list identifier for identifying a fault list each for each of said plurality of fault models, a vector set identifier for identifying a vector set each for each of said fault lists, a tolerance limit selector for selecting a tolerance limit each for each of said fault lists, thereby each fault model having an associated fault list, an associated vector set and an associated tolerance limit, a dropped-fault compactor for compacting each of said vector set such that the compacted vector set identifies all the faults in the associated fault list or a drop in fault list coverage is within the associated tolerance limit and a vector set creator for combining all compacted vector sets.

Preferably in the testing system at least one of said tolerance limits is based on computational resources.

Preferably in the testing system at least one of said tolerance limits is based on a number of faults dropped from coverage.

Preferably in the testing system at least one of said tolerance limits is based on power usage.

Preferably in the testing system at least one of said tolerance limits is based on heat dissipation.

Preferably in the testing system faults are dropped while a segment is constructed and a number of faults dropped is proportional to a size of the segment.

Still preferably in the testing system the computational resource is CPU usage.

Still preferably in the testing system said computational resource is memory usage.

Another aspect of the present invention is a computer program product including a computer-readable media comprising computer code that enables a VLSI tester to test VLSI circuits, said computer code comprising: a fault model selector code for enabling a computer to select a plurality of fault models, a fault list identifier code for enabling a computer to identify a fault list each for each of said plurality of fault models, a vector set identifier code for enabling a computer to identify a vector set each for each of said fault lists, a tolerance limit code selector enabling a computer to select a tolerance limit each for each of said fault lists, thereby each fault model having an associated fault list, an associated vector set and an associated tolerance limit, a dropped-fault compactor code for enabling a computer to compact each of said vector set such that the compacted vector set identifies all the faults in the associated fault list or a drop in fault list coverage is within the associated tolerance limit; and a vector set creator code for enabling a computer to combine all compacted vector sets.

Preferably in the computer program product at least one of said tolerance limits is based on computational resources.

Preferably in the computer program product at least one of said tolerance limits is based on a number of faults dropped from coverage.

Preferably in the computer program product at least one of said tolerance limits is based on power usage.

Preferably in the computer program product at least one of said tolerance limits is based on heat dissipation.

Preferably in the computer program product faults are dropped while a segment is constructed and a number of faults dropped is proportional to a size of the segment.

Still preferably in the computer program product said computational resource is CPU usage.

Preferably in the computer program product said computational resource is memory usage.

III. BRIEF DESCRIPTION OF THE DRAWINGS

The above objectives and advantages of the present invention will become more apparent by describing in detail preferred embodiments thereof with reference to the attached drawings in which:

FIG. 2 shows a pseudocode for a preferred embodiment of the static compaction method of the present invention.

FIG. 3 shows a pseudocode for the overlapped validation technique used in the preferred embodiment illustrated in FIG. 2.

FIG. 4 shows a pseudocode for the technique used to update the range information for the arrays LOW and HIGH used in the preferred embodiment illustrated in FIG. 2.

FIG. 5 shows a pseudocode illustrating the update of targets.

FIG. 6 shows a pseudocode for the technique used to find segments in the preferred embodiment.

FIG. 7 shows a pseudocode illustrating how critical faults are dropped in the preferred embodiment.

FIG. 8 shows a pseudocode showing a technique to compute targets for the refinement phase of the preferred embodiment.

FIG. 9 shows a pseudocode illustrating the pruning technique used in the preferred embodiment.

FIG. 10 shows a pseudocode illustrating the validation phase of the pruning technique.

FIG. 11 shows a pseudocode illustrating the refinement phase of the pruning technique.

FIG. 12 shows Table 1 illustrating the results of the simulation experiments for several benchmark circuits.

FIG. 13 shows Table 2 illustrating the simulation experiments for several production level circuits.

IV. DETAILED DESCRIPTION OF THE PREFERRED EMBODIMENTS

Compaction process used for compacting test sets typically consists of several iterations. However, the number of iterations is not known a priori. Such a number depends on the circuit, test set and target fault set. Compaction under resource constraints, as in the present invention, is non-trivial because specific allocation of expendable resources to a single iteration in the compaction process can significantly affect both the size of the compacted test set and the speed of the compaction process. Also, not all resources allocated for an iteration may be expended during the iteration. Therefore, by computing the actual resources expended during the iteration, it is possible to more accurately allocate resources to subsequent iterations.

In the preferred embodiment of the present invention the fault coverage curve is examined and a resource allocation strategy for each iteration is mathematically developed.

The preferred embodiment of the present invention is illustrated using a fast segment pruning technique. Detailed explanation of such a conventional pruning technique itself can be found in S. K. Bommu and S. T. Chakradhar and K. B. Doreswamy, "Static compaction using overlapped restoration and segment pruning", in *Proceedings, International Conference on Computer Aided Design*, November, 1998. The segment pruning technique uses a two-phase approach in identifying the synchronizing prefix of individual faults. Significant speed up is achieved in the pruning time without compromising on the pruning efficiency. The factors contributing to the speed up are:

Use of the two-phase approach for identifying the synchronizing prefix.

Use of the information obtained from the simulations performed during segment construction, to minimize the number of simulations during pruning.

Early dropping of faults. In other words, during pruning, a fault is simulated only till its detection time to determine its detectability, after which, it is dropped.

The preferred embodiment has been implemented as part of a two-phase static compaction algorithm. Further details of the two-phase static compaction algorithm can be found in S. K. Bommu and S. T. Chakradhar and K. B. Doreswamy, "Static test sequence compaction based on segment reordering and fast vector restoration", in *Proceedings, International Test Conference*, October, 1998; See S. K. Bommu and S. T. Chakradhar and K. B. Doreswamy, "Static compaction using overlapped restoration and segment pruning", in *Proceedings, International Conference on Computer-Aided Design*, November, 1998; and S. K. Bommu and S. I Chakradhar and K. B. Doreswamy, "Vector Restoration using Accelerated Validation and Refinement", in *Proceedings, Asian Test Symposium*, December, 1998.

Figure 14:
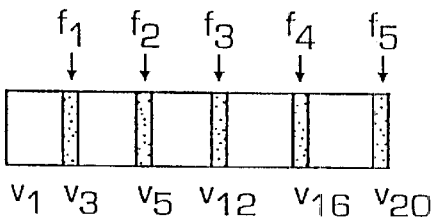
FIG. 14 shows an example to illustrate the definition of segments.

A segment is a subsequence $v_i, \ldots, v_j$ ($1 \leq i \leq j \leq n$) such that, for any future target fault f, the detection time $D(f)<i$. In the example of FIG. 14 the restoration process for fault $f_5$ results in the subsequence $v_{17}, \ldots, v_{20}$. At this point, faults $f_1$, $f_2$, and $f_3$ are not detected by the restored sequence. The detection times of all these faults is earlier than 17. Therefore, subsequence $v_{17}, \ldots, v_{20}$ is a segment. Because $f_4$ has a later detection time than $f_3$, and because $f_4$ is detected by the restored sequence, $f_4$ cannot be a future target fault.

FIG. 2 shows a pseudocode for a preferred embodiment using the techniques of the present invention. The number of iterations of the while loop in FIG. 2 cannot be predicted in advance. The procedure OVERLAPPED-VALIDATION shown in FIG. 3 identifies a sequence of vectors that is guaranteed to contain a segment. This sequence is trimmed by the procedure OVERLAPPED_REFINEMENT to determine the segment. If the segment size is large, the two procedures can require significant computation. Therefore, to accelerate these procedures, we use the pre-specified tolerance limit on fault coverage to drop faults that lead to large segments.

Figure 1:
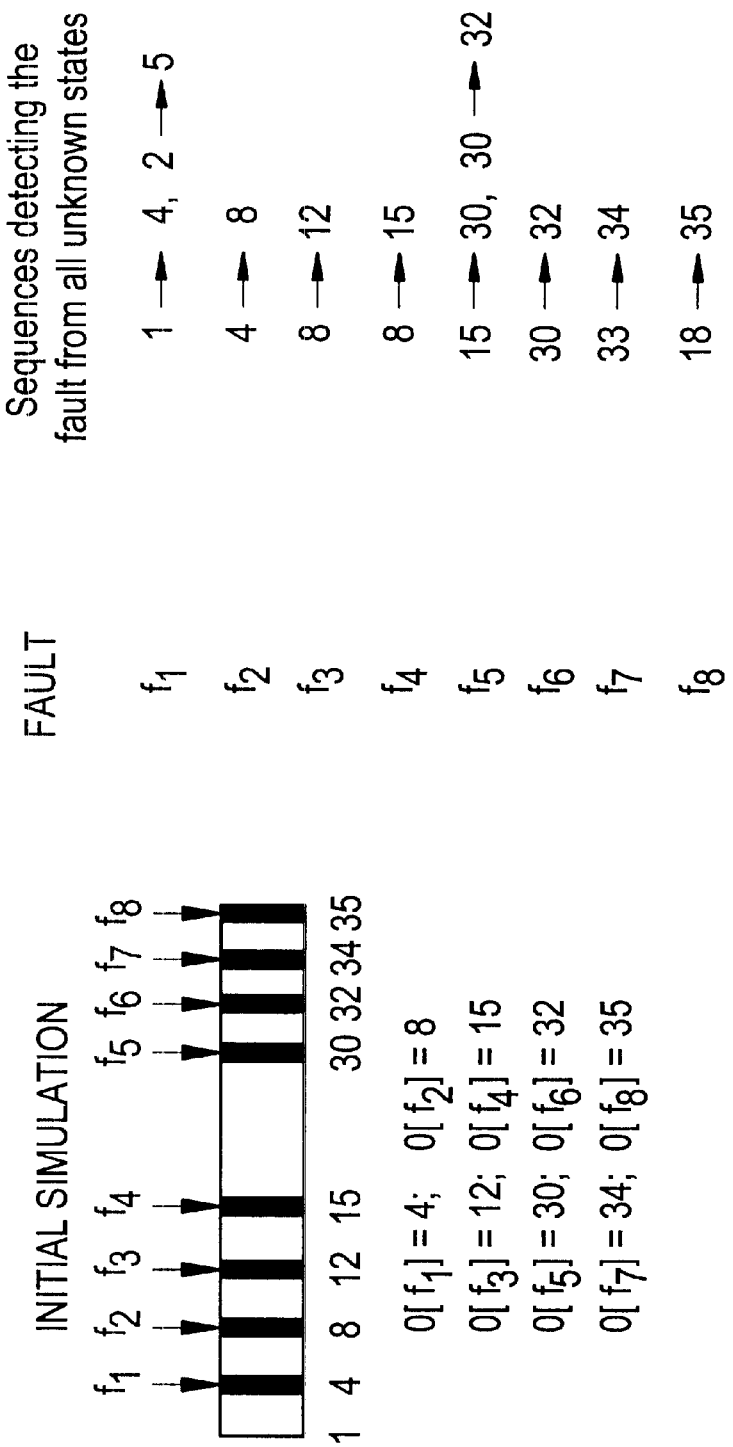
FIG. 1 shows an example illustrating the resource constrained static compaction method of the present invention.

The techniques of the present invention is shown using the example in FIG. 1. The test set consists of thirty five vectors $v_1$ . . . , $v_{35}$ and the fault list has eight faults $F_{u=\{f1\}}$, . . . , $f_8\}$. FIG. 1 also shows detection times and subsequences that detect every fault, assuming an unknown initial state. For example, fault $f_8$ is detected after the application of vector $v_{35}$. Therefore, the detection time $D[f_8]=35$. Only subsequence $V_{18}$, . . . , $V_{35}$ detects this fault, assuming an unknown initial state. Note that most faults are detected by exactly one subsequence, except for faults $f_1$ and $f_5$ that are detected by two subsequences.

The vector threshold considered in the example is fifteen. In this example, two segments are found: $S_1=\{v_{30}, \ldots, v_{34}\}$ and $S_2=\{v_2, \ldots, v_{15}\}$. During the construction of the first segment, the compaction technique drops fault $f_8$. This is because identification of the segment that includes $f_8$ requires use of resources that exceed resource constraints imposed on the compaction process. The resource-constrained restoration of the first segment is illustrated herein. It should be noted that, for this example, the second segment can be derived without exceeding resource constraints. The segment pruning method cannot further reduce the number of vectors in the first segment. However, the pruning method can reduce the number of vectors in the second segment. The segment pruning procedure for the second segment is also illustrated herein.

IVA. Resource-Constrained Restoration of First Segment

The first segment $v_{30}, \ldots, V_{34}$ is derived as follows. The SCOPE algorithm shown in FIG. 2 is a preferred embodiment of the present invention. The restoration is begun with this algorithm. Since this is the first iteration, there are no vectors in CompactSet. Lines 2–4 are initialization steps that are required before a new segment is derived. Note that the same initialization steps (Lines 13–15) are performed before the search for a new segment is begun. Variable base=35 since fault $f_8$ has the maximum detection time $D[f_8]=35$. The target fault list $F_T$ has only one fault $f_8$. The procedure RESET_LOW_HIGH initializes the arrays LOW and HIGH. For this example, if $f \epsilon F_u$, then LOW[f]=1 and HIGH[f]=36. In the algorithm OVERLAPPED_VALIDATION, initially, $F_T=f_8$. The variable start=36 since HIGH[$f_8$]=36. The validation process considers five sequences in the following order:

The first sequence considered for fault simulation is $v_{35}$. This is because, from line 4, low=36. The fault set $F_s=\{f_8\}$ because all other faults in $F_u$ have detection times less than 35. Fault simulation of vector $v_{35}$ does not detect any fault in $F_s$. The range information is updated using procedure UPDATE_LOW_HIGH as follows: HIGH[$f_8$]=35. The procedure UPDATE_TARGETS does not produce any new targets. The first fault considered in this procedure is $f_p=f_7$ (line 3). The variable high=HIGH[$f_8$]=35. Also, $D[f_p]=34$ and high>$D[f_p]$. Therefore, $f_7$ is not a new target. The procedure DROP_CRITICAL_TARGETS returns trivially. This is because the sequence length is 1 and this is less than the vector threshold of 15.

The next sequence considered for fault simulation is Seq=f{$v_{34}$, $v_3$}. This is because, from line 4, low=34. The set $F_T$ still includes only one fault $f_8$. However, the set $F_s=\{f_7, f_8\}$ because the detection times of both $f_7$ and $f_8$ are equal to or greater than 34. Fault simulation of the sequence Seq does not detect any fault in $F_T$. Therefore, range information is updated as follows: HIGH{$f_8$}=HIGH{$f_7$}=34. The procedure UPDATE_TARGETS results in one new target. The new target is determined as follows. The first fault considered by the procedure is $f_p=f_7$. The variable high=HIGH{$f_8$}=34. Since $D[f_7]=34$, therefore, high$\leq D[f_7]+1$. Also, HIGH[$f_7$]$\leq D[f_7]$. Therefore, $f_7$ is a new target and it is included in target fault list $F_T$. The set $F_D$ has no faults that were detected during fault simulation. The second fault considered is $f_p=f_6$. The variable high=Minimum (HIGH [$f_7$], HIGH[$f_8$])=29. since $D[f_6]=26$, therefore high>$D[f_6]+1$ and $f_6$ is not a new target. The procedure DROP_CRITICAL_TARGETS returns trivially.

The next sequence considered is Seq=$\{V_{32}, \ldots, V_{35}\}$. For this pass, $F_T=F_8=\{f_6, f_7, f_8\}$. Again, fault simulation of the sequence Seq detects fault one fault $f_7$ in the set $F_s$. Range information is updated as follows: HIGH[$f_6$]=HIGH[$f_8$]=32, and LOW[$f_7$]=32. The procedure UPDATE_TARGETS does several things. It produces a new target fault $f_6$. Also, fault $f_7$ is marked detected and it is included in the set of detected faults $F_D$. Since $f_7$ is detected, we delete it from both sets $F_T$ and $F_u$. Again, the routine DROP_CRITICAL_TARGETS returns trivially since the sequence Seq has only four vectors, and this is less than the vector threshold of 15.

The next sequence considered is Seq=$\{v_{28}, \ldots, v_{35}\}$. The set $F_T=\{f_6, f_8\}$, and the set $F_s=\{f_5, f_6, f_8\}$. Note that fault $f_5$ is considered in $F_s$, because $D[f_5]=30 \geq 26$ and HIGH[$f_6$]= 31>26. Fault simulation of the sequence Seq results in the detection of faults $f_5$ and $f_6$. Range information is updated as follows: HIGH[$f_8$]=LOW[$f_5$]=LOW[$f_6$]=26. The procedure UPDATE_TARGETS marks the faults $f_5$ and $f_6$ as detected, and it eliminates these faults from the sets $F_T$ and $F_u$. Faults $f_5$ and $f_6$ are added to the detected fault set $F_D$. Note that at this point of time, $F_D=\{f_5, f_6, f_7\}$. The routine DROP_CRITICAL_TARGETS again returns trivially.

The next sequence considered is Seq=$\{v_{20}, \ldots, v_{35}\}$. The sets $F_T=F_s=\{f_8\}$. Fault simulation of sequence Seq does not detect any faults. Range information is updated as follows: HIGH[$f_8$]=20. The procedure UPDATED_TARGETS produces no new targets. However, the procedure DROP_CRITICAL_TARGETS performs several computations. First, the call to procedure CHECK_RESOURCES from line 1, results in a return value of True. This is because the sequence Seq already has 16 vectors but the vector threshold is only 15. Also, the number of target faults is less than the allowed maximum. Therefore, the procedure DROP_CRITICAL_TARGETS drops fault $f_8$ from the sets $F_T$ and $F_u$. Also, this fault is not considered for further restoration. The next step is to refine the sequence Seq that now detects faults $F_D=\{f_5, f_6, f_7\}$. The procedure COMPUTE_REFINEMENT_TARGETS chooses a set of faults within $F_D$ as the next target faults. The global arrays HIGH and LOW have the following information: LOW[$f_5$]=LOW[$f_6$]= 28, LOW[$f_7$]=32, HIGH[$f_6$]=32, HIGH[$f_5$]=36, and HIGH [$f_7$]=34. Also, the array ND has the following information: ND[$f_5$]=ND[$f_6$]=32, and ND[$f_7$]=34. From lines 2, 3 and 4 of procedure COMPUTE_REFINEMENT_TARGETS, low= 28, high=32, and base=34. Line 5 computes the new targets $F_T$ to be $\{f_5, f_6\}$. Line 6 adds these faults into the set $F_u$. Line 7 deletes these faults from the detected fault set $F_D$. The procedure COMPUTE_REFINEMENT_TARGETS returns control back to line 10 of the procedure OVERLAPPED_VALIDATION. Since a fault was dropped, control breaks out of the loop beginning at line 3. This completes the overlapped validation phase.

The target faults and the restored sequence obtained after overlapped validation phase is then passed on to the overlapped refinement phase. The segment obtained after refinement is $v_{30}, \ldots, v_{34}$, and this sequence detects faults $\{f_5, f_6, f_7\}$. This segment is also processed by the procedure SEGMENT-PRUNE. However, no vectors can be eliminated.

IVB. Pruning of Second Segment

The second segment derived by the algorithm SCOPE consists of the vectors $v_2, \ldots, v_{15}$, that detects faults $\{f_1, f_2, f_3, f_4\}$. It is possible to eliminate several vectors from this segment. The procedure SEGMENT_PRUNE is called with the following arguments: $F_D = \{f_1, f_2, f_3, f_4\}$, $F_u$=Nil, CompactSet=$\{v_{30}, \ldots, v_{34}\}$. Other relevant information for faults in $F_D$ is as follows: LOW[$f_1$]=2, LOW[$f_2$]=4, LOW[$f_3$]=8, LOW[$f_4$]=8, and ND[fi]=8, ND[$f_2$]=8, ND[$f_3$]=12, and ND[$f_4$]=15.

For this example, the loop in line 2 is executed three times. For the first iteration, top=2, and F=$\{f_1, f_2, f_3, f_4\}$1. These values are passed as arguments to the procedure VALIDATE_PRUNE. In this procedure, initially, max=2, and min=15. During the first iteration of the loop (line 3) of procedure VALIDATE_PRUNE, we remove $2^0=1$ vector from the input sequence. The new sequence is given $(v_{temp}, \ldots V_{min})=(v_3, \ldots, v_{15})$. The task at hand is to determine if faults in F are still detected by the new sequence. This time, the initial states for fault simulation are the same good and faulty circuit states obtained after simulation of the sequence CompactSet. For this example, faults $f_2, f_3$, and $f_4$ do not have to be considered for fault simulation. This is because these faults will be detected by the sequence $(v_3, \ldots, v_5)$ irrespective of the initial state. Note that $F_{sim} = \{f_i\}$ since LOW[$f_1$]<temp. The variable last =5. The sequence considered for fault simulation is $v_3, \ldots, v_5$. This is because fault $f_1$ is already detected at vector $v_5$ if we assume an unknown initial state for the vector sequence $v_2, \ldots, v_5$. With a known initial state, it may be possible that the fault now gets detected at $v_5$ or earlier using the shorter sequence $v_3 \ldots, v_5$. To allow the illustration of the subtleties of the pruning procedure, assume that fault $f_1$, is indeed detected by the sequence $v_3, \ldots, v_5$, assuming a known initial state. Since the fault is detected, the variable max=3 (line 12). Control goes back to the beginning of the loop (line 3). During the second iteration, temp=4, and $F_{sim} = \{f_i\}$. The sequence considered for fault simulation is $(v_4 \ldots v_8)$-Subsequent iterations can be worked out in a similar way.

Another aspect of the invention is to establish that the number of faults allowed to be dropped while constructing a segment, is proportional to the size of the segment under construction. This relationship can be mathematically derived directly from the fault coverage curve. If the current segment under construction consists of the sequence $(v_i \rightarrow v_j)$, then the number of faults that can be dropped (critical faults) is proportional to the size j−i)) of the segment under construction. The exact formula that is used in the simulation experiments is $\delta x = H_C NST^*[(j-i)/V_T]$. Here, $V_T$ represents the vector threshold. No faults are dropped during the construction of a segment until the number of vectors in the segment exceeds the vector threshold. The constant $H_C NST$ is chosen to be 2 for all the experiments.

In the method of the present invention the tolerance limits can be based on computational resources. Any computational resource can be used to specify a tolerance limit. Examples of computational resources that form the basis for tolerance limits are CPU usage, memory, computation time, etc. The tolerance limit can also be set based on a number of faults dropped from coverage. Another entity that can be used as the basis for setting a tolerance limit is power usage. Heat dissipation can also form the basis of setting the tolerance limit.

IVC. A VLSI Testing System with Dropped Faults

Figure 15:
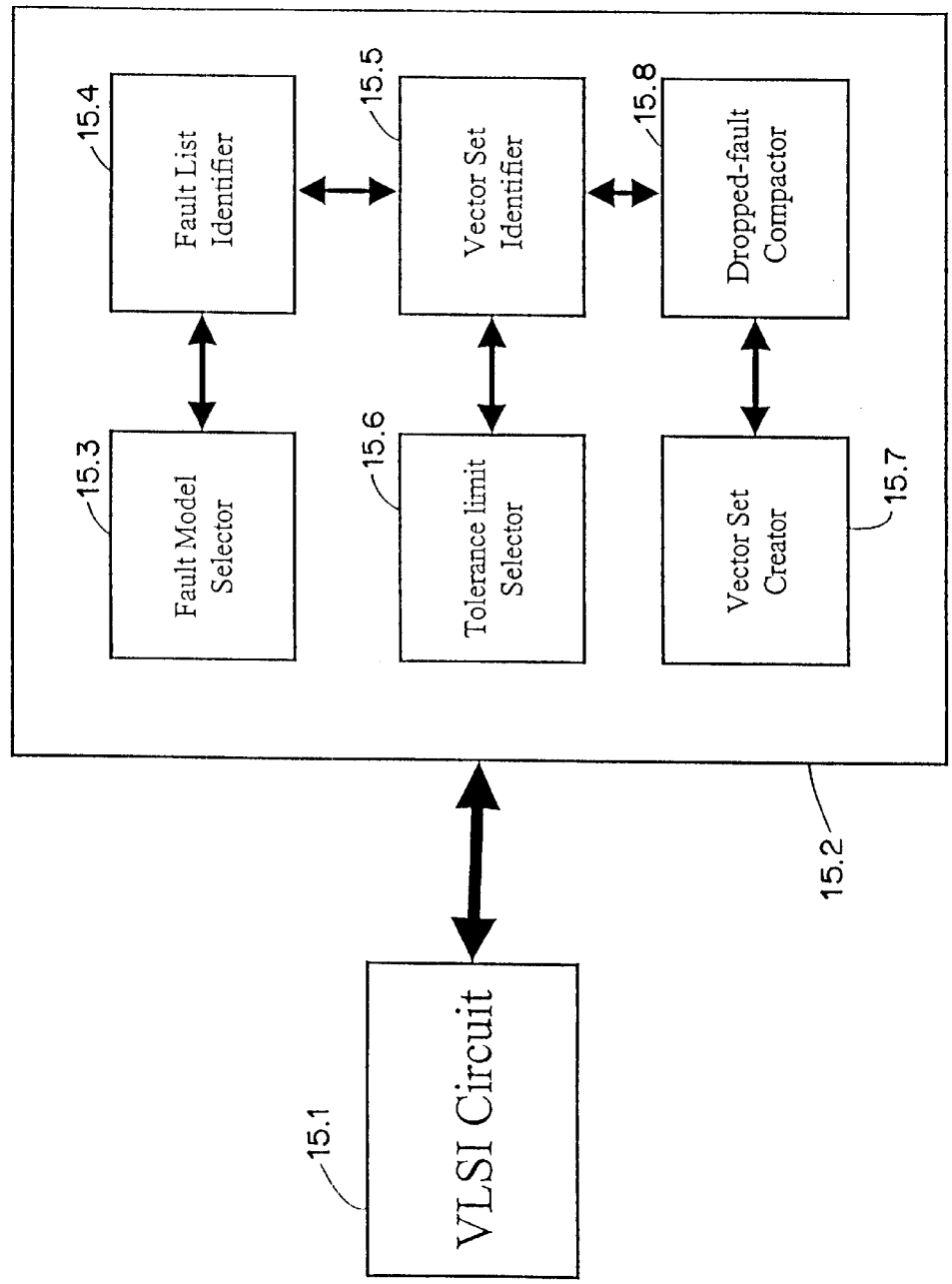
FIG. 15 shows a block diagram of a preferred embodiment of a testing system according to the present invention.

The preferred embodiment of a testing system according to the present invention is depicted in FIG. 15. The preferred embodiment is a system for testing VLSI circuits. The VLSI circuit 15.1 is tested for faults using the testing system. The testing system comprises a test generator 15.2. The test generator further comprises a fault model selector for selecting a plurality of fault models. A fault list identifier 15.4 identifies a fault list each for each of the plurality of fault models. A vector set identifier 15.5 identifies a vector set each for each of the fault lists. A tolerance limit selector 15.6 selects a tolerance limit each for each of said fault lists. Thus, each fault model has an associated fault list, an associated vector set and an associated tolerance limit. A dropped-fault compactor 15.8 compacts each of said vector set such that the compacted vector set identifies all the faults in the associated fault list or a drop in fault list coverage is within the associated tolerance limit. A vector set creator 15.7 combines all compacted vectors sets.

IVD. A Computer Program Product

Another aspect of the present invention is a computer program product. This program product includes a computer readable media. A skilled artisan would know that the computer readable media is not limited to any specific type of storage devices and includes any kind of device in which computer instructions can be stored and/or transmitted. A preferred embodiment of the computer program product includes a floppy disc or a CD ROM disk comprising computer instructions or computer code. The computer code that enables a VLSI testing computer to test VLSI circuits. The computer code comprises a fault model selector code for enabling the computer to select a plurality of fault models. A fault list identifier code for enabling the computer to identify a fault list each for each of said plurality of fault models. A vector set identifier code for enabling the computer to identify a vector set each for each of said fault lists. A tolerance limit code selector for enabling the computer to select a tolerance limit each for each of said fault lists, thereby each fault model having an associated fault list, an associated vector set and an associated tolerance limit. A dropped-fault compactor code for enabling the computer to compact each of said vector set such that the compacted vector set identifies all the faults in the associated fault list or a drop in fault list coverage is within the associated tolerance limit. A vector set creator code for enabling the computer to combine all compacted vector sets.

Additionally, a skilled artisan would know that the VLSI testing system of the present invention can be run on any computer including a general purpose PC, workstation or a mainframe computer or a special computing machine specifically designed to be used as a testing system. This system can also be run remotely through a network. Transmission of the computer code through a network or through wireless transmission means is also within the scope of this invention.

IVE. Experimental Results

The proposed static compaction technique was implemented in a C program called SCOPE. The implementation includes all techniques described in the preceding sections, critical fault elimination and 2-φ segment pruning.

Experimental results are reported for ISCAS benchmark circuits and several industrial designs. The ISCAS benchmark is discussed in detail in F. Brglez, D. Bryan, and K. Kozminski, "Combinational profiles of sequential benchmark circuits," *Int. Symposium on Circuits and Systems*, pp. 1929–1934, May 1989. Table I presents results for ISCAS circuits. Table 2 presents results for several industrial designs.

All the tables report number of vectors in the original and compact vector set. Compaction quality is reported as percentage reduction in the original vector test. The CPU seconds are reported for Sun® UltraSPARC® work station. Since critical fault dropping changes the fault coverage of the final compacted sequence, the coverage numbers are given before and after compaction when this technique is used.

The initial vector set used for ISCAS circuits were obtained using the test set generator STRATEGATE. The details of this test generator can be seen in T. M. Niermann and J. H. Patel, "HITEC: A test generation package for sequential circuits," *Proc. European Conf Design Automation (EDAC)*, pp. 214–218, March 1991. The results for compaction on ISCAS circuits are given in Table 1. The results obtained by SCOPE with and without critical fault elimination are reported. Column SCOPE—gives the results obtained by SCOPE when critical fault elimination is not used, and the column SCOPE+ represents the results obtained by SCOPE where a maximum of 1% loss in coverage is allowed. SCOPE with SCOPE+ gave an average compaction of 50% and finished running on the entire ISCAS benchmark circuits in less than 15 minutes. The loss in coverage is found to be negligible and is almost always much less than 1%. For example, in the circuit s400 both the compaction speed and efficiency were significantly improved by just dropping one fault! The time taken by SCOPE+ was about 1 to 1.5 times the time taken for fault simulation with fault dropping on the initial vector sequence.

Industrial designs have several non-Boolean primitives, such as tristate buffers, bi-directional buffers and buses. In addition, they have set/reset flip-flops and multiple clocks. Original test sets for these circuits were derived using a commercial test generator. Compaction results are shown in Table 2. SCOPE+ uses critical fault elimination with a vector threshold as 25 and a maximum allowed coverage loss of 1%. In general we find that the time taken by SCOPE+ is about 2 to 3 times the time taken for fault simulation with fault dropping on the input test sequence. As demonstrated in the table, critical fault elimination plays a key role in controlling the time taken for compaction for large circuits. For example, in the circuit p306 critical fault elimination brought down the run time by a factor of 3, moreover no coverage was lost in the process and achievable compaction was significantly improved. For production designs, on the average SCOPE+ gave about 41% compaction with a loss in coverage of less than 0.4%.

The experimental results demonstrate the superiority of the new static compaction algorithm in terms of performance and compaction efficiency.

Other modifications and variations to the invention will be apparent to those skilled in the art from the foregoing disclosure and teachings. Thus, while only certain embodiments of the invention have been specifically described herein, it will be apparent that numerous modifications may be made thereto without departing from the spirit and scope of the invention.

What is claimed is:

1. A method of generating a vector set, said vector set being used for testing sequential circuits, said method comprising:
    a) selecting a plurality of fault models;
    b) identifying a fault list each for each of said plurality of fault models;
    c) identifying a vector set each for each of said fault lists;
    d) selecting a tolerance limit each for each of said fault lists, thereby each fault model having an associated fault list, an associated vector set and an associated tolerance limit;
    e) compacting each of said vector set such that the compacted vector set identifies all the faults in the associated fault list or a drop in fault list coverage is within the associated tolerance limit; and
    f) creating a vector set by combining all vector sets compacted in step e.

2. The method of claim 1 wherein at least one of said tolerance limits is based on computational resources.

3. The method of claim 2 wherein said computational resource is CPU usage.

4. The method of claim 2 wherein said computational resource is memory usage.

5. The method of claim 1 wherein at least one of said tolerance limits is based on a number of faults dropped from coverage.

6. The method of claim 1 wherein at least one of said tolerance limits is based on power usage.

7. The method of claim 1 wherein at least one of said tolerance limits is based on heat dissipation.

8. The method of claim 1 wherein faults are dropped while a segment is constructed and a number of faults dropped is proportional to a size of the segment.

9. The method of claim 1 wherein said compaction comprises multiple iterations and each of said tolerance limits being dynamic and can be changed for at least one of said multiple iterations, wherein at least one of said tolerance limits can be zero.

10. A method of generating a test vector set, said test vector set being used for testing a sequential circuit, said method comprising:
    a) specifying a fault coverage;
    b) identifying a list of faults that are covered and a list of faults that are not covered;
    c) compacting said vector set so that fault coverage after compaction is at least as large as fault coverage specified in step a, wherein during each iteration of compaction faults may be exchanged between said list of faults that are covered and said list of faults that are not covered.

11. A system for testing VLSI circuits comprising a test generator, the test generator further comprising:
    a fault model selector for selecting a plurality of fault models;
    a fault list identifier for identifying a fault list each for each of said plurality of fault models;
    a vector set identifier for identifying a vector set each for each of said fault lists;
    a tolerance limit selector for selecting a tolerance limit each for each of said fault lists, thereby each fault model having an associated fault list, an associated vector set and an associated tolerance limit;
    a dropped-fault compactor for compacting each of said vector set such that the compacted vector set identifies all the faults in the associated fault list or a drop in fault list coverage is within the associated tolerance limit; and a vector set creator for combining all compacted vector sets.

12. The system of claim 11 wherein at least one of said tolerance limits is based on computational resources.

13. The system of claim 12 wherein said computational resource is CPU usage.

14. The system of claim 12 wherein said computational resource is memory usage.

15. The system of claim 11 wherein at least one of said tolerance limits is based on a number of faults dropped from coverage.

16. The system of claim 11 wherein at least one of said tolerance limits is based on power usage.

17. The system of claim 11 wherein at least one of said tolerance limits is based on heat dissipation.

18. The system of claim 11 wherein faults are dropped while a segment is constructed and a number of faults dropped is proportional to a size of the segment.

19. A computer program product including a computer-readable media comprising computer code that enables a VLSI tester to test VLSI circuits, said computer code comprising:

a fault model selector code for enabling a computer to select a plurality of fault models;

a fault list identifier code for enabling a computer to identify a fault list each for each of said plurality of fault models;

a vector set identifier code for enabling a computer to identify a vector set each for each of said fault lists;

a tolerance limit code selector for enabling a computer to select a tolerance limit each for each of said fault lists, thereby each fault model having an associated fault list, an associated vector set and an associated tolerance limit;

a dropped-fault compactor code for enabling a computer to compact each of said vector set such that the compacted vector set identifies all the faults in the associated fault list or a drop in fault list coverage is within the associated tolerance limit; and a vector set creator code for enabling a computer to combine all compacted vector sets.

20. The computer program product of claim 19 wherein at least one of said tolerance limits is based on computational resources.

21. The computer program product of claim 20 wherein said computational resource is CPU usage.

22. The computer program product of claim 20 wherein said computational resource is memory usage.

23. The computer program product claim 19 wherein at least one of said tolerance limits is based on a number of faults dropped from coverage.

24. The computer program product of claim 19 wherein at least one of said tolerance limits is based on power usage.

25. The computer program product of claim 19 wherein at least one of said tolerance limits is based on heat dissipation.

26. The computer program product of claim 19 wherein faults are dropped while a segment is constructed and a number of faults dropped is proportional to a size of the segment.

* * * * *

UNITED STATES PATENT AND TRADEMARK OFFICE
CERTIFICATE OF CORRECTION

PATENT NO.    : 6,467,058 B1                                                               Page 1 of 1
DATED         : October 15, 2002
INVENTOR(S)   : Srimat T. Chakradhar, Surendra K. Bommu and Kiran B. Doreswamy It is certified that error appears in the above-identified patent and that said Letters Patent is hereby corrected as shown below:

Column 7,
Line 15, delete "$F_{u-\{f1\},...,f8\}}$" insert -- $Fu = \{f_1, ..., f_8\}$ --

Column 8,
Line 2, delete "$f\{v_{34}, v_3\}$" insert -- $f\{v_{34}, v_{35}\}$ --

Signed and Sealed this

Thirteenth Day of May, 2003

JAMES E. ROGAN
*Director of the United States Patent and Trademark Office*